(12) United States Patent
Jonas et al.

(10) Patent No.: US 6,419,406 B1
(45) Date of Patent: Jul. 16, 2002

(54) OPTOMODULE

(75) Inventors: Ivan Jonas, Åkersberga; Odd Steijer, Bromma; Paul Eriksen, Tyresö; Ulf Sven Olof Holm, Sollentuna; Phillip Peter Laubert, Stockholm; Bengt Olof Lindström, Älta; Börje Rosborg, Skarpnäck; Lars Erik Pontus Lundström, Saltsjö-Boo; Jan-Åke Engstrand, Trångsund; Hans-Christer Moll, Enskede, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/608,230

(22) Filed: Jun. 30, 2000

(30) Foreign Application Priority Data

Jun. 30, 1999 (SE) .................................................. 9902498

(51) Int. Cl.[7] .................................................. G02B 6/36
(52) U.S. Cl. .............................. 385/94; 385/88; 385/92; 385/52
(58) Field of Search ............................... 385/88–94, 49, 385/52, 14

(56) References Cited

U.S. PATENT DOCUMENTS 5,123,066 A * 6/1992 Acarlar ...................... 385/14
5,416,871 A * 5/1995 Takahashi et al. ............. 385/88
6,315,465 B1 * 11/2001 Mizue et al. .................. 385/94
6,322,257 B1 * 11/2001 Kryzk .......................... 385/88
6,332,720 B1 * 12/2001 Shimaoka et al. ............. 385/88
2001/0024551 A1 * 9/2001 Yonemura et al. ............. 385/88

FOREIGN PATENT DOCUMENTS

EP 0472755 3/1992
EP 0582992 2/1994

* cited by examiner

Primary Examiner—Hemang Sanghavi
(74) Attorney, Agent, or Firm—Burns, Doane, Swecker & Mathis, L.L.P.

(57) ABSTRACT

A plastic encapsulated optomodule is provided which includes a leadframe, an optoelectric component, an electric component, and an optical connection interface integrated in the capsule. The electric component is connected electrically to the leadframe. The electric component and the optoelectric component are mutually connected electrically and the optoelectric component and the integrated connection interface are connected together via at least one optical waveguide. The electric component is provided on a first part of the leadframe and electric contact surfaces (80) are provided on leads (5a and 5b) in the leadframe (1). The optoelectric component is provided on a second part of the leadframe and the optical connection interface arranged on an optodevice is connected to a third part of the leadframe. The optodevice is aligned by alignment elements provided on the leadframe and the leadframe includes alignment elements that conform with corresponding alignment elements on a plastic-encapsulation mold tool.

10 Claims, 8 Drawing Sheets

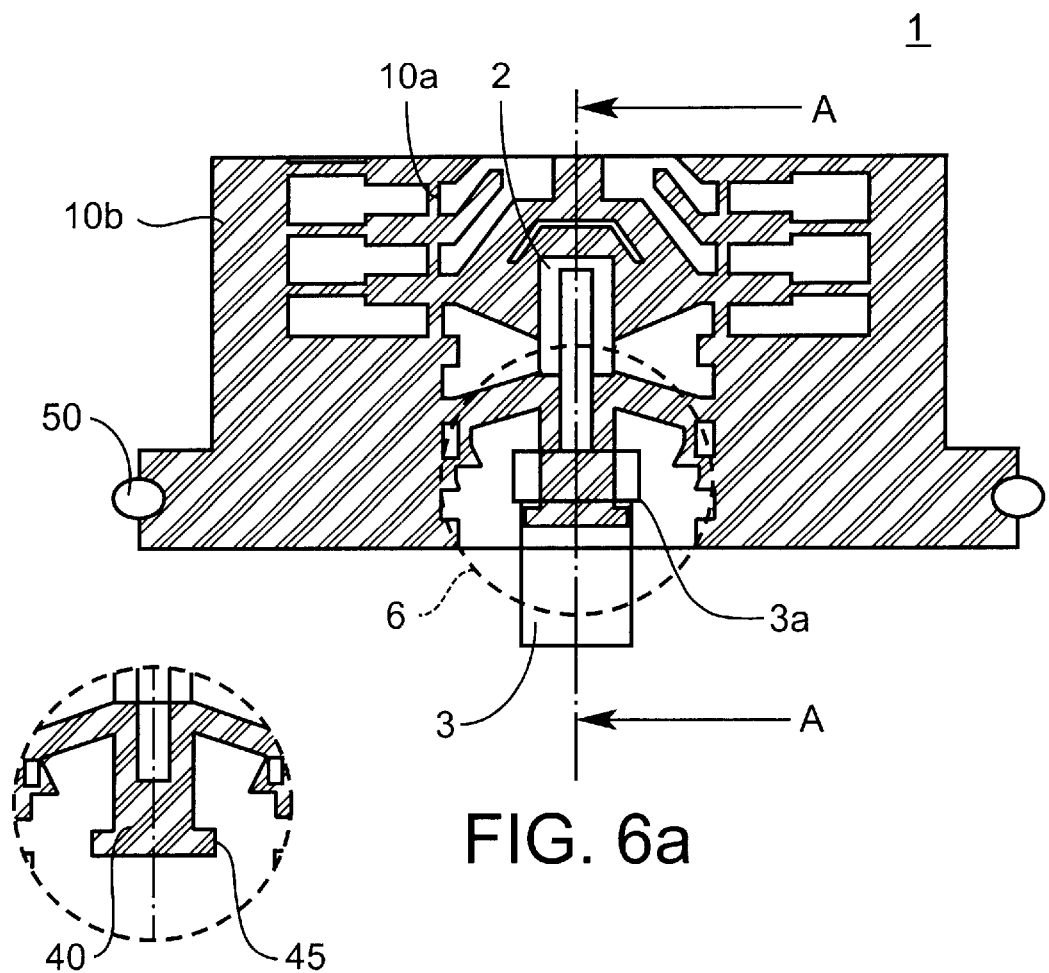
FIG. 6a
FIG. 6
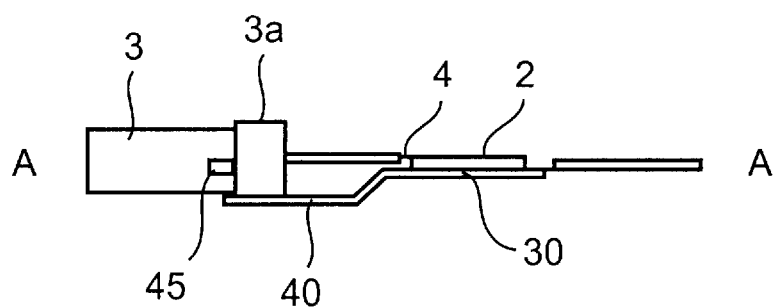
FIG. 6b

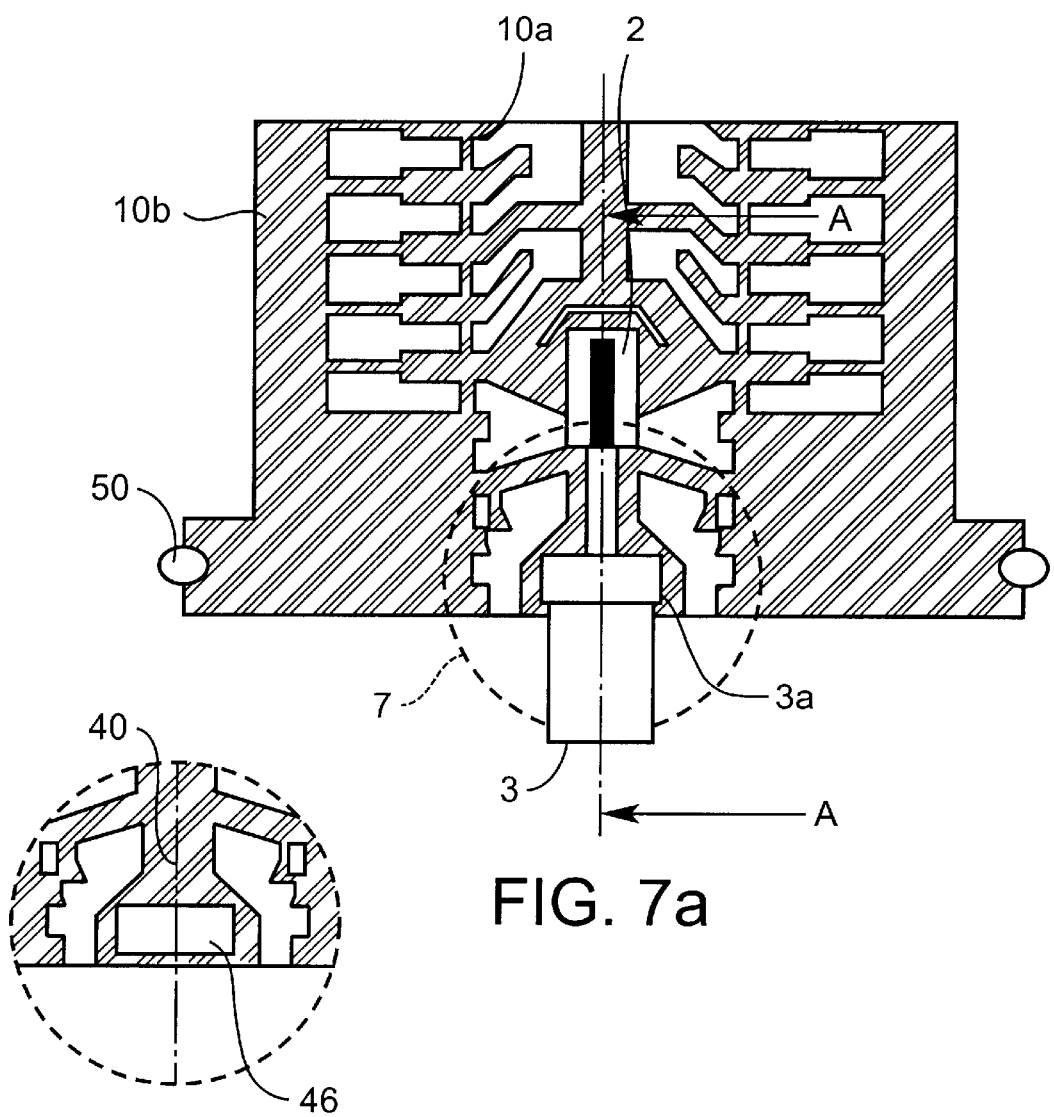
FIG. 7
FIG. 7a
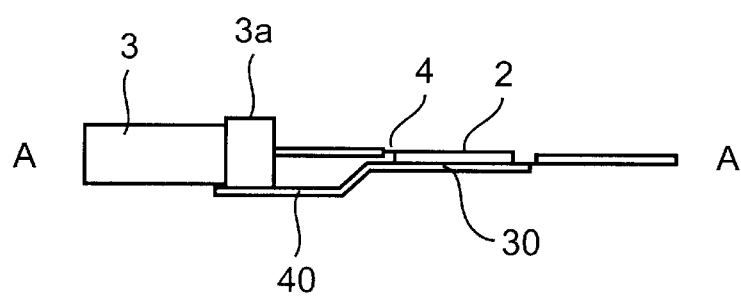
FIG. 7b

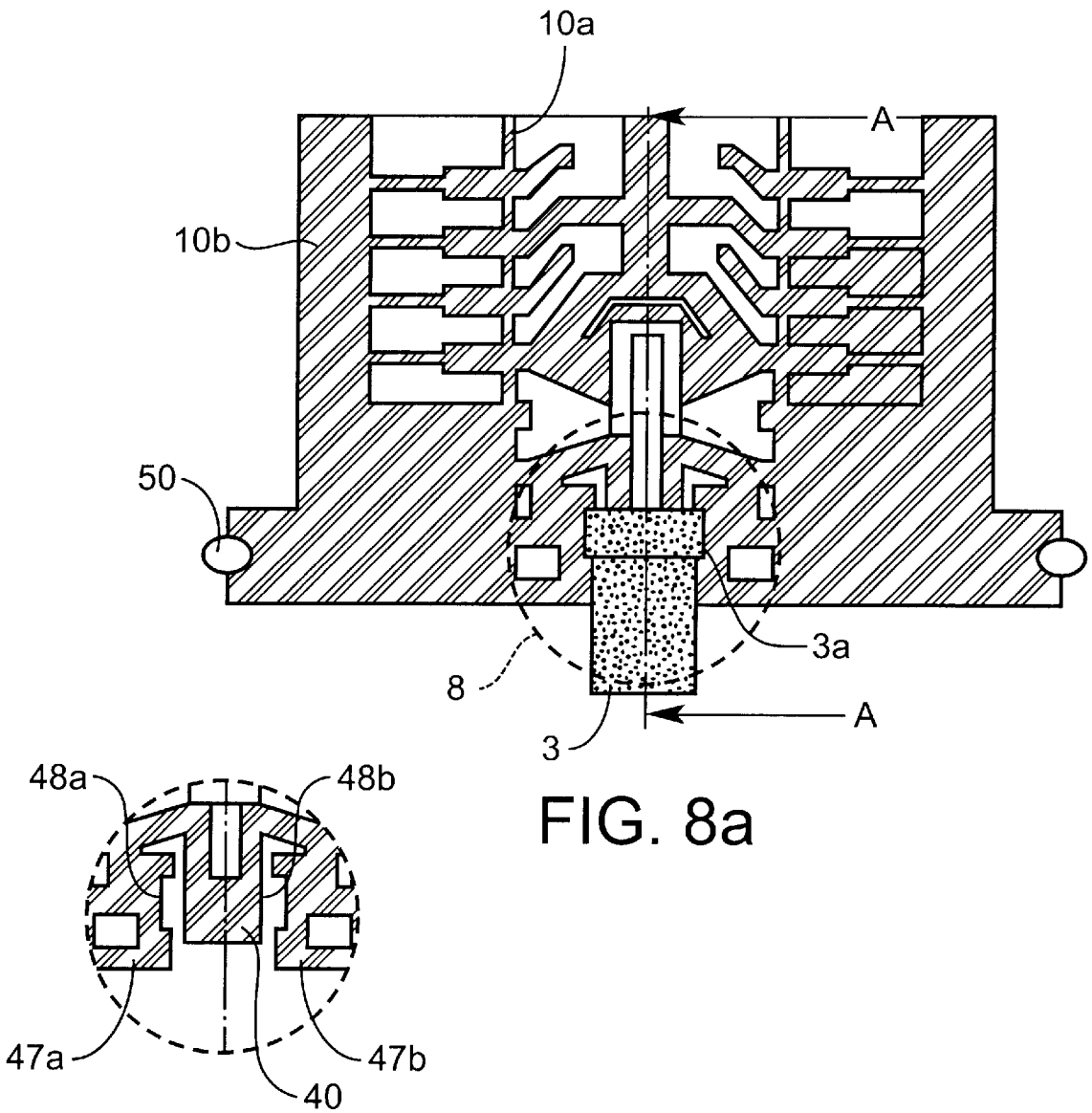
FIG. 8a
FIG. 8
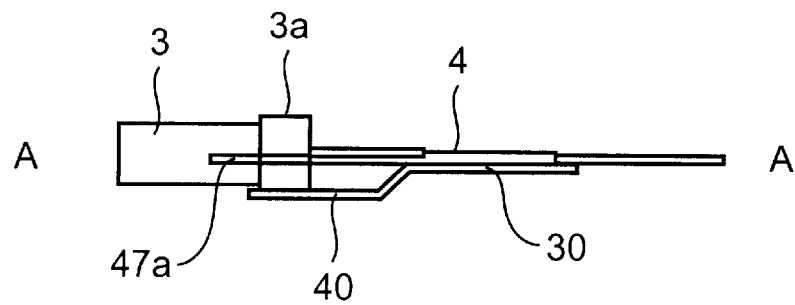
FIG. 8b

OPTOMODULE

This application claims priority under 35 U.S.C. §§119 and/or 365 to 9902498-6 filed in Sweden on Jun. 30, 1999; the entire content of which is hereby incorporated by reference.

FIELD OF INVENTION

The present invention relates to a plastic-encapsulated optomodule.

DESCRIPTION OF THE BACKGROUND ART

Optomodules intended for telecommunications application for instance are normally encapsulated in hermetic metal capsules and are provided with a pigtail for making the optical connection. In order to be able to widen the use of optical signal transmissions it must be possible to produce components and connectors at lower costs than at present, and also to reduce the cost of mounting these components. One of the primary reasons for such high component costs is because of the extremely high mechanical precision that is required in aligning an optoelectric component with a wavequide, such as an optical fibre, and in aligning a waveguide in one component with another waveguide.

Plastic encapsulation, transfer moulding, of optomodules reduces production costs. In present day technology, a plastic capsule that includes optoelectrical components can either be provided with a fibre pigtail of varying length that consists of an optical fibre which extends out from within the component, or a device that is integrated in a capsule wall.

SE 9701833 describes a plastic encapsulated optomodule which includes an integrated optical device.

One problem encountered in the manufacture of plastic encapsulated optomodules, particularly injection moulded modules, that include an optical device integrated in the capsule wall is that the device shall be aligned and fixed in the capsule moulding tool.

SUMMARY OF THE INVENTION

The object of the present invention is to eliminate or at least reduce this problem.

This object is achieved by the present invention with a plastic encapsulated optomodule as defined by the claims.

One advantage afforded by the present invention is that no sub-module is required for the optoelectrical component.

Another advantage is that the optoelectrical component can be readily constructed, manufactured and tested relatively inexpensively.

Still another advantage is that the plastic encapsulated optomodule requires little room on a circuit board.

Another advantage is that the present invention the manufacture of new and re-constructed optomodules is facilitated through the medium of a modular construction procedure The invention will now be described in more detail with reference to preferred embodiments thereof and also with reference to the accompanying drawings.

BRIEF DESCRIPTION OF THE DRAWINGS

FIGS. 6 and 6a illustrates from above the alignment of the optodevice with the leadframe, in accordance with a first embodiment.

FIG. 6b is a side view illustrating alignment of the optodevice with the leadframe in accordance with a first embodiment.

FIGS. 7 and 7a illustrates from above alignment of the optodevice with the leadframe in accordance with a second embodiment.

FIG. 7b is a side view illustrating alignment of the optodevice with the leadframe in accordance with a second embodiment.

FIGS. 8 and 8a illustrates from above alignment of the optodevice with the leadframe in accordance with a third embodiment.

FIG. 8b is a side view illustrating alignment of the optodevice with the leadframe in accordance with a third embodiment.

DESCRIPTION OF PREFERRED EMBODIMENTS

Figure 1:
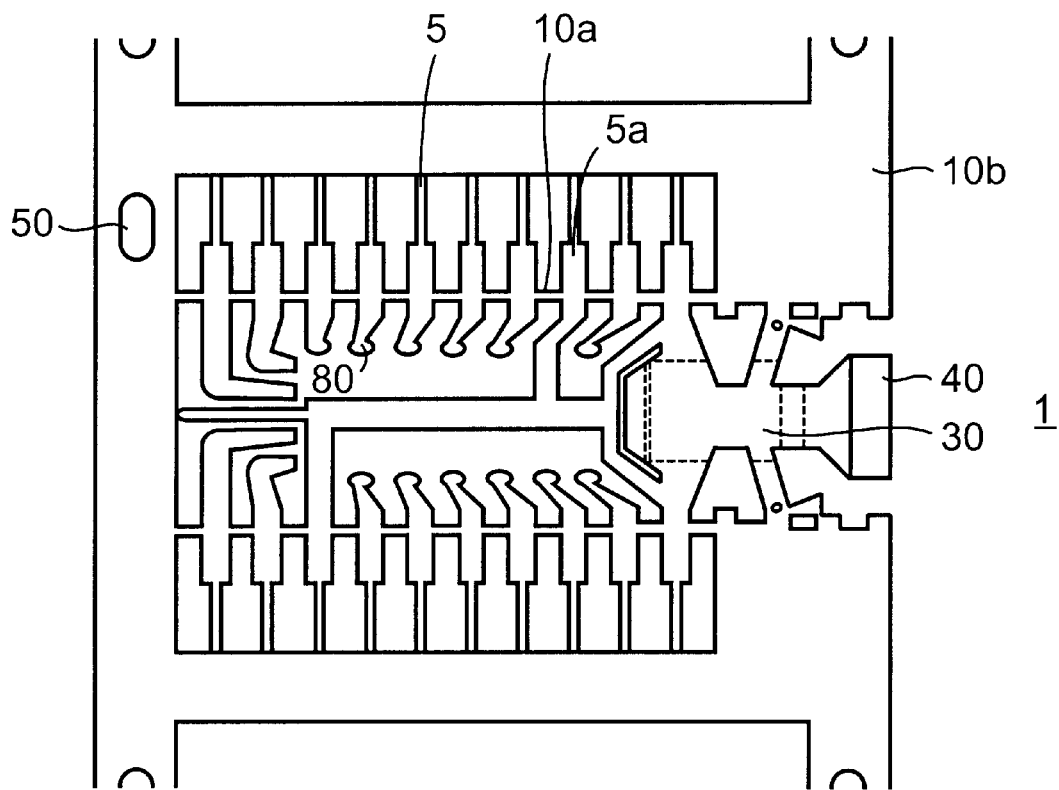
FIG. 1 illustrates an embodiment of a leadframe included in the invention.

FIG. 1 illustrates an embodiment of an inventive leadframe included in a plastic encapsulated optomodule. The leadframe 1 includes a first and a second support device 10a and 10b, which function to fixate different parts of the leadframe 1, for instance leads 5, prior to encapsulation. The second support device includes alignment elements 50 for aligning the leadframe in an encapsulating mould cavity.

The leadframe includes a first part 20 which is connected to earth via at least one earth lead 5a. The first part functions, among other things, as a support for an electric component 1A (see FIG. 2) together with electric contact surfaces 80 at the ends of the leads 5 and 5a.

A second part 30 functions to support an optoelectric component 2 included in an optohybrid 1B. A third part 40 functions to support, fix and align an optodevice 3 included in said optohybrid 1B. The electric component and the optoelectric component may be interconnected electrically via bonding wires.

Figure 2:
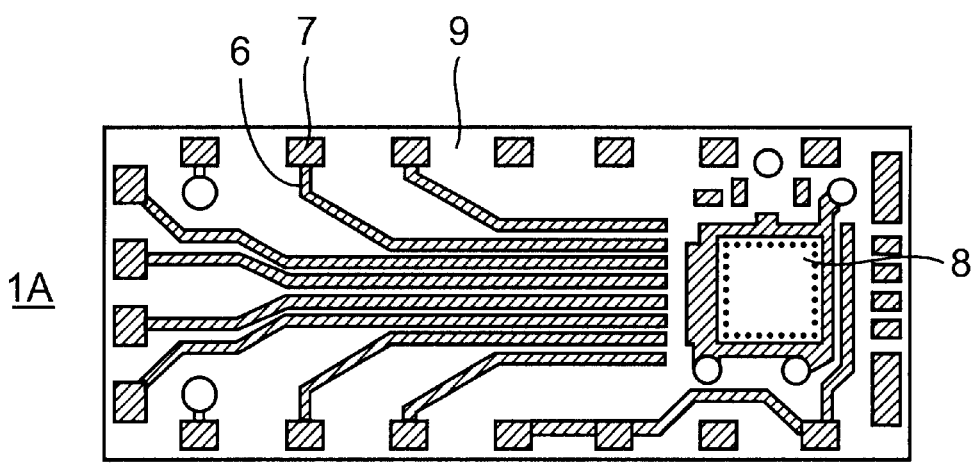
FIG. 2 illustrates an embodiment of electric components that include a ceramic carrier, ASIC and passive components, in accordance with the invention.

The electric component 1A is shown in FIG. 2, from which it will be seen that the electric component 1A of this embodiment includes a ceramic carrier 9 which carries an electrically conductive pattern 6, electrical connection surfaces 7 and an ASIC 8 (Application Specific Integrated Circuit). The connection surfaces 7 are connected to electric contact surfaces 80 at the end of the lead 5. The electric component can be surface soldered or glued to the electric contact surfaces 80 disposed on the end of respective leads 5 and 5a. The particular configuration of the contact surfaces 80 also has the added function of preventing the leads from being pulled out of the capsule. The ASIC may alternatively be arranged directly on said first part 20 and connected electrically to the leads with the aid of bonding wires.

Figure 3:
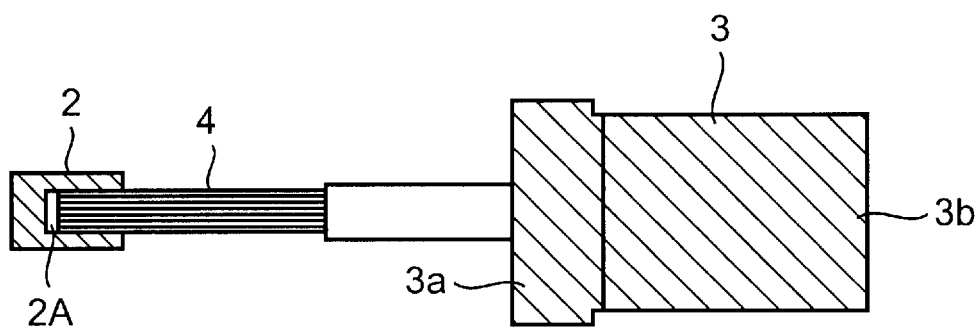
FIG. 3 illustrates an embodiment of an optohybrid that includes an optoelectrical component and an optodevice, in accordance with the invention.

FIG. 3 illustrates a so-called optohybrid 1B. The optohybrid includes an optoelectrical component 2 and an optodevice 3. The optoelectrical component 2 includes a laser 2a to which one or more optical waveguides 4 are connected. The optical waveguide or waveguides 4 terminates/terminate in a connecting interface 3b on said optodevice 3. The optodevice 3 includes a flange 3a.

Figure 4A:
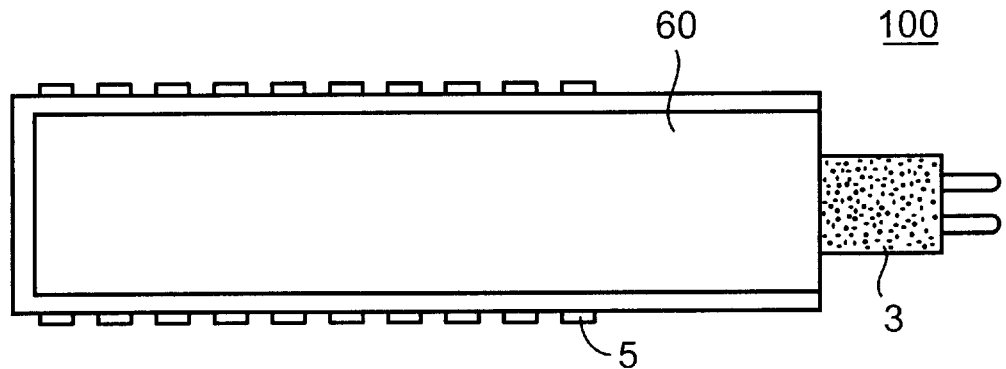
FIG. 4a illustrates from above one embodiment of a plastic encapsulated optomodule having an integrated optical interface in accordance with the invention.
Figure 4B:
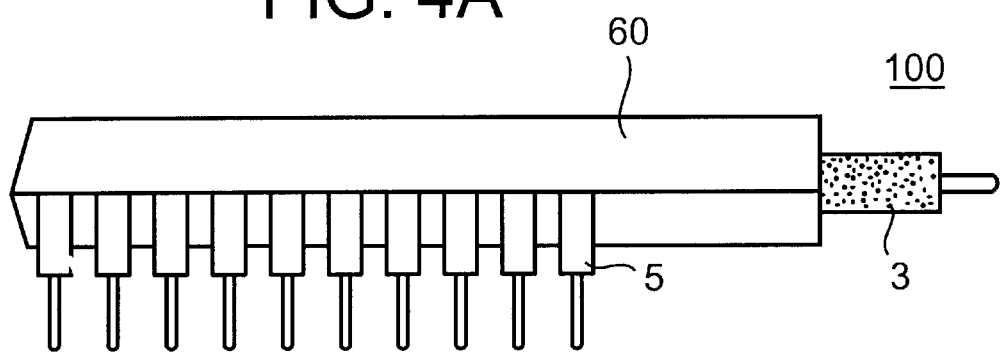
FIG. 4b is a side view of one embodiment of a plastic encapsulated optomodule having an integrated optical interface in accordance with the invention.

FIGS. 4a and 4b illustrate the plastic encapsulated optomodule 100. The leads 5 in the leadframe and the optodevice protrude out from the capsules 60 in the plastic encapsulated optomodule 100.

Figure 5:
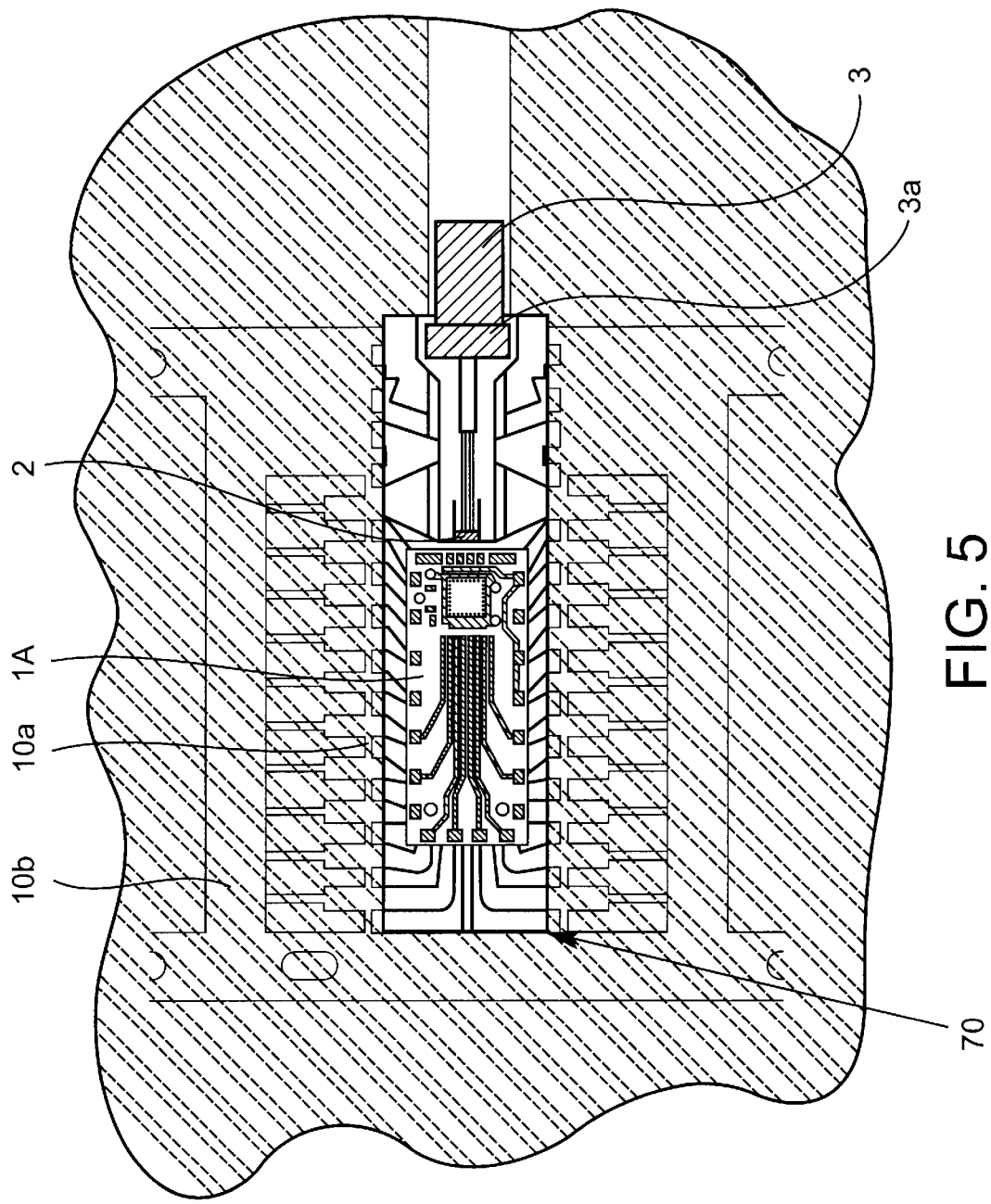
FIG. 5 is an overview of the placement of the leadframe, the electric components and the optohybrid in an injection moulding cavity.

FIG. 5 is an overview illustrating the arrangement of the leadframe, on which said optohybrid 1B and said electric component 1A are provided, is positioned in a mould cavity 70 for plastic encapsulation by means of transfer moulding. The mould cavity 70 terminates inwardly of the leadframe support devices, so as to enable these devices to be removed from the leads 5 and 5a subsequent to encapsulation. The mould cavity 70 includes an opening for accommodating the optodevice 3. A mould tool or die defining said mould cavity is adapted so that the gap between the optodevice and the optodevice-accommodating opening is restricted to some few tens of a micrometer. This prevents plastic from penetrating between the optodevice and the recess which accommodates the optodevice in the mould tool.

FIGS. 6a and 6b are enlarged views of the second and third leadframe parts 30 and 40. FIG. 6b is a sectional view taken on the line A—A in FIG. 6a. The optodevice 3 and the optoelectric component are arranged in different planes in the leadframe 1. This positions the waveguides 4 correctly between the optodevice 3 and the optoelectric component 2. Tabs 45 are folded-up from the leadframe on the third part 40 of said leadframe 1 where the optodevice 3 is arranged. These tabs are arranged to partially embrace the optodevice 3 such as to fixate said device and align it in a direction orthogonal to the longitudinal direction of the waveguides 4. The tabs 45 are also arranged to fixate and align the optodevice 3 in a direction parallel with the waveguides 4, by virtue of said tabs being fixed against an edge of a flange 3a on the optodevice 3.

FIGS. 7 and 7a illustrate another embodiment for aligning and fixating the optodevice with the aid of alignment elements provided on the leadframe. In this embodiment, the third part of the leadframe includes a recess whose position, shape and size conform to those of the flange 3a provided on the optodevice 3. When the flange is received in the recess, the device will be fixated in a direction parallel with an orthogonal to the waveguides 4 disposed between the optodevice 3 and the optoelectric component 2. As with the earlier described embodiment, the third and the second leadframe parts 40 and 30 respectively are disposed in different planes such as to position the waveguides 4 correctly between the optoelectric component 2 and the optodevice 3.

FIG. 8 illustrates another embodiment for aligning and fixating the optodevice with the aid of alignment elements provided on the leadframe 1. In this embodiment, the optodevice 3 is arranged on the third leadframe part 40, which is on a lower level than the remainder of the leadframe. Two tabs 47a and 47b are provided on a respective side of the third leadframe part 40 and function to fixate the optodevice 3 in a plane above said third leadframe part, in a direction orthogonal to the longitudinal direction of the waveguides 4. The tabs 47a and 47b include recesses whose shape and size conform to the shape and size of the flange on the optodevice 3, such as to fixate the optodevice also in a direction parallel to the longitudinal direction of the waveguides 4.

Figure 9A:
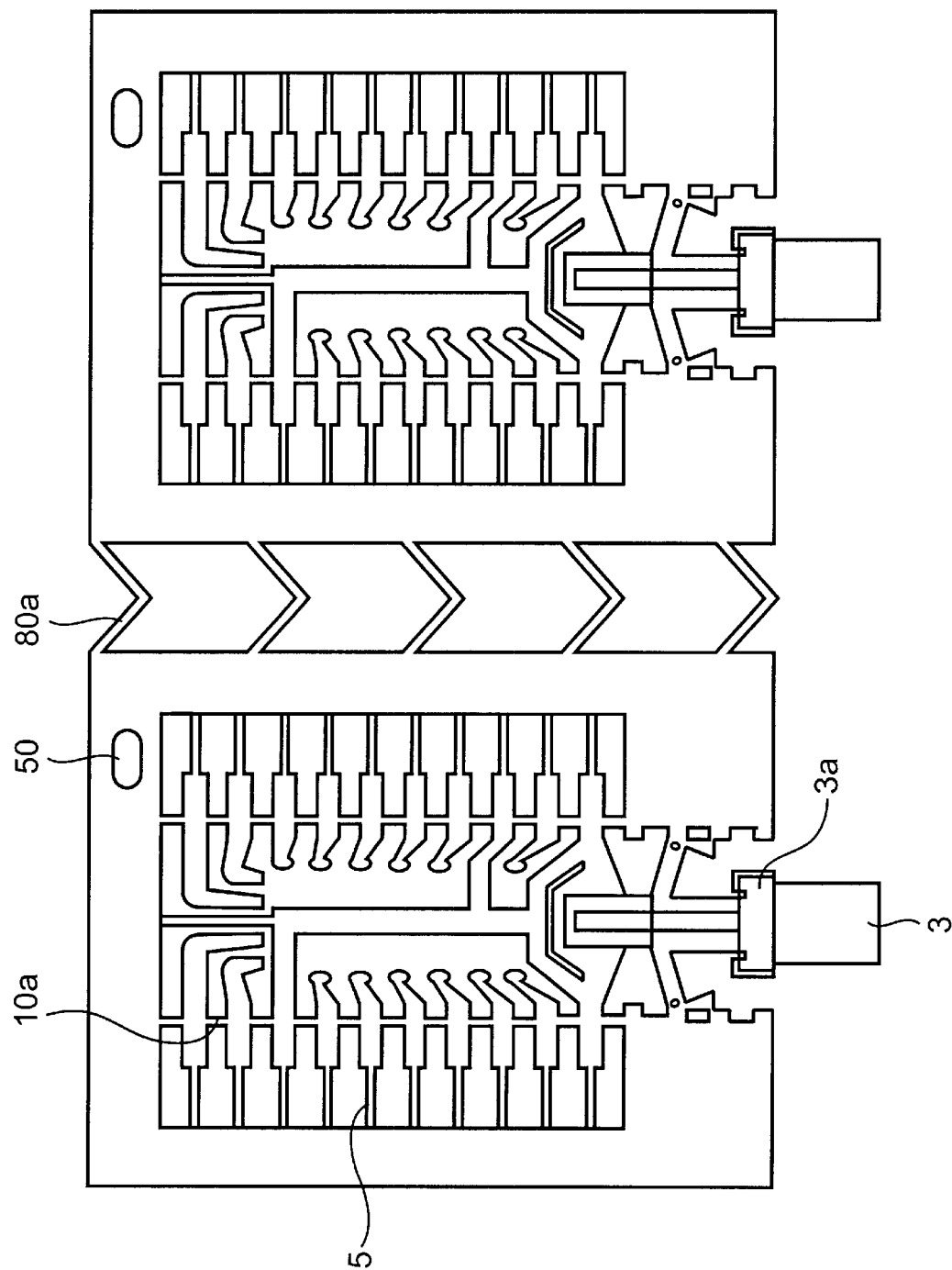
FIG. 9a shows how the leadframes can be arranged relative to one another during encapsulation in accordance with a first embodiment.
Figure 9B:
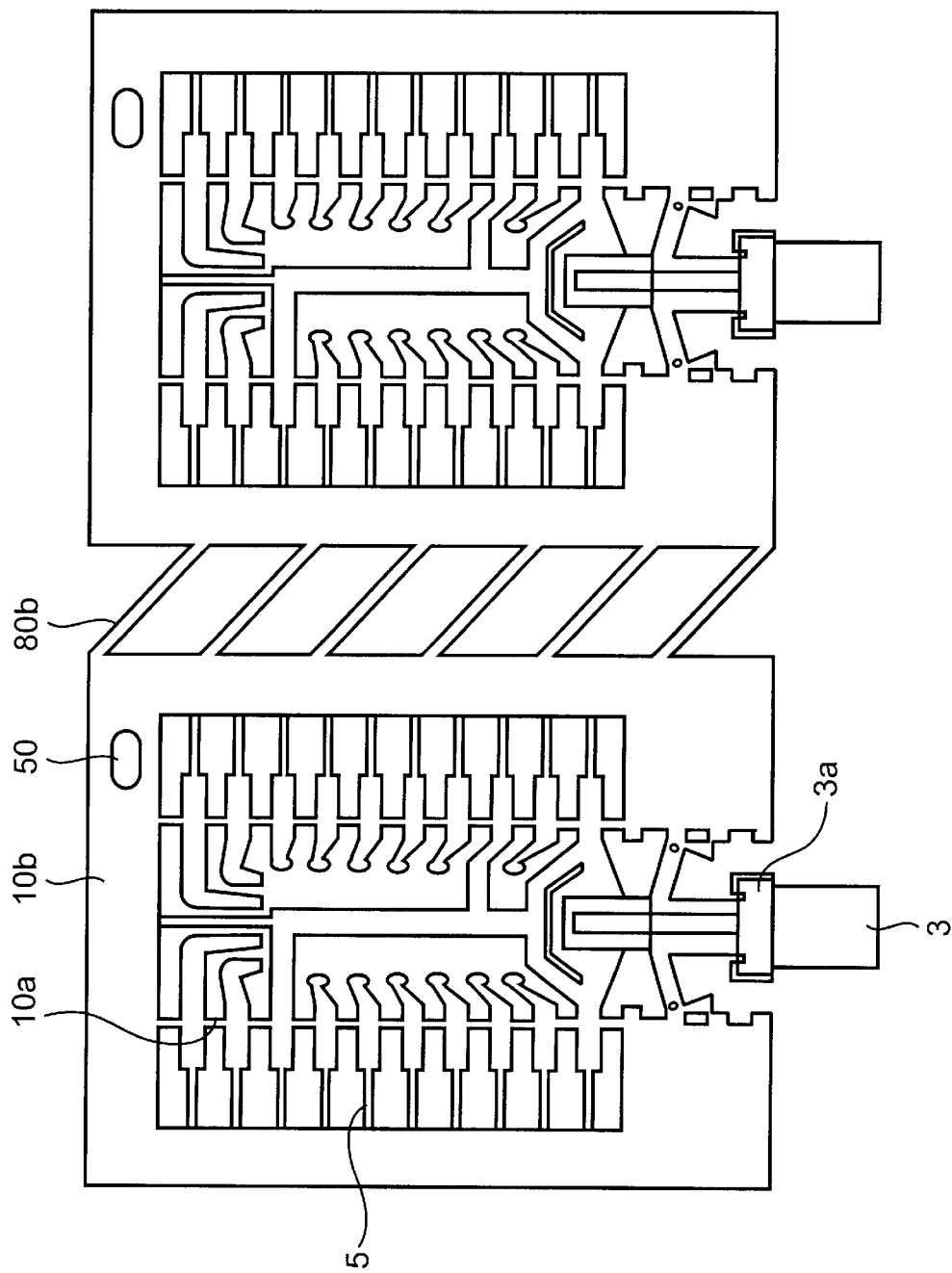
FIG. 9b shows how the leadframes can be arranged relative to one another during encapsulation in accordance with a second embodiment.

FIGS. 9a and 9b illustrate respective methods of interconnecting the leadframes during manufacture. The leadframes are interconnected resiliently via V-shaped resilient elements 80a or inclined spring elements 80b. This enables the positioning tolerance requirement between individual leadframes to be reduced.

It will be understood that the invention is not restricted to the aforedescribed and illustrated exemplifying embodiments thereof and that modifications can be made within the scope of the following claims.

What is claimed is:

1. An encapsulated optomodule which includes a leadframe, an optoelectric component, an electric component, and a capsule-integrated optical connection interface, wherein the electric component is connected electrically to the leadframe, wherein the electric component and the optoelectric component are mutually connected electrically, and wherein the optoelectric component and the integrated connection interface are mutually connected via at least one optical waveguide, characterized in that the electric component is connected to a first part of the leadframe and connected electrically to electric contact surface (80) on leads (5a and 5b) in said leadframe (1); in that the optoelectric component is connected to a second part of said leadframe, and the optical connection interface is connected to an optodevice provided on a third part of said leadframe; in that the leadframe includes optodevice aligning elements; and in that the leadframe includes alignment elements that are adapted to corresponding alignment elements on a plastic-encapsulation mould tool.

2. An encapsulated optomodule according to claim 1, characterized in that the electric component is an applied specific integrated circuit (ASIC) provided on the first leadframe part (20) and connected electrically to said leads via bonding wires.

3. An encapsulated optomodule according to claim 1, characterized in that the electric component includes a ceramic carrier which carries an electrically conductive pattern to which there is connected at least one application specific integrated circuit (ASIC) and at least one passive component, wherein said conductive pattern is adapted to the electric contact surfaces (80) on the leads (5 and 5a).

4. An encapsulated optomodule according to claim 1, characterized in that the optodevice connection interface is of the MT-type.

5. An encapsulated optomodule according to 1, characterized in that said module is encapsulated by means of a transfer moulding process.

6. An encapsulated optomodule according to claim 5, characterized in that the optodevice is aligned in a direction orthogonally to the longitudinal direction of the waveguide by means of tabs that are folded up from the third leadframe part and adapted to partially embrace said optodevice.

7. An encapsulated optomodule according to claim 6, characterized in that the optodevice includes an outwardly projecting part which is adapted to fixate the optodevice on the leadframe with the aid of said tabs, in a direction parallel with the longitudinal direction of the waveguide.

8. An encapsulated optomodule according to claim 5, characterized in that the optodevice is aligned in a direction orthogonal to and parallel with the longitudinal direction of the waveguide with the aid of a recess (46) provided in the third leadframe part, said recess conforming to the outwardly projecting part on said optodevice.

9. An encapsulated optomodule according to claim 5, characterized in that the optodevice is aligned in a direction orthogonal to and parallel with the longitudinal direction of the waveguide by two tabs (47*a* and 47*b*) provided on a respective side of said third leadframe part and in a plane above said third leadframe part, wherein said tabs include recesses that conform to the outwardly projecting part of said optodevice.

10. An encapsulated optomodule according to claim 5, characterized in that the optodevice and the optoelectric component are disposed in different planes on the leadframe.

* * * * *